United States Patent
Frougier et al.

(10) Patent No.: US 10,804,398 B2
(45) Date of Patent: Oct. 13, 2020

(54) METHOD OF FORMING WRAP-AROUND-CONTACT AND THE RESULTING DEVICE

(71) Applicant: GLOBALFOUNDRIES Inc., Grand Cayman (KY)

(72) Inventors: Julien Frougier, Albany, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/160,701

(22) Filed: Oct. 15, 2018

(65) Prior Publication Data
US 2020/0119180 A1 Apr. 16, 2020

(51) Int. Cl.
*H01L 29/78* (2006.01)
*H01L 21/8234* (2006.01)
*H01L 21/768* (2006.01)
*H01L 29/66* (2006.01)

(52) U.S. Cl.
CPC ...... *H01L 29/785* (2013.01); *H01L 21/76816* (2013.01); *H01L 21/76843* (2013.01); *H01L 21/823418* (2013.01); *H01L 21/823431* (2013.01); *H01L 29/66545* (2013.01); *H01L 29/66795* (2013.01); *H01L 2029/7858* (2013.01)

(58) Field of Classification Search
CPC ......... H01L 21/76816; H01L 21/76843; H01L 21/823418; H01L 21/823431; H01L 29/785; H01L 29/66545; H01L 29/66795
See application file for complete search history.

(56) References Cited

U.S. PATENT DOCUMENTS

| | | | |
|---|---|---|---|
| 7,534,675 B2 | 5/2009 | Bangsaruntip et al. | |
| 7,795,677 B2 | 9/2010 | Bangsaruntip et al. | |
| 8,198,621 B2 | 6/2012 | Rogers et al. | |
| 8,217,381 B2 | 7/2012 | Rogers et al. | |
| 9,847,390 B1 | 12/2017 | Xie et al. | |
| 2013/0087833 A1* | 4/2013 | Wang | H01L 29/66522 257/192 |
| 2015/0311320 A1* | 10/2015 | Cheng | H01L 21/02532 438/157 |
| 2018/0337176 A1* | 11/2018 | Lee | H01L 29/66795 |
| 2019/0334009 A1* | 10/2019 | Cheng | H01L 29/785 |

* cited by examiner

*Primary Examiner* — Joseph M Galvin, III
(74) *Attorney, Agent, or Firm* — Ditthavong & Steiner, P.C.

(57) ABSTRACT

A device including source-drain epitaxy contacts with a trench silicide (TS) liner wrapped around the source-drain contacts, and method of production thereof. Embodiments include a device having a gate structure formed over a substrate; source-drain epitaxy contacts including a trench silicide (TS) liner covering the source-drain epitaxy contacts; TS contacts formed on the TS liner over the source-drain epitaxy contacts; and a dielectric pillar disposed in a TS cut between the source-drain epitaxy contacts. The TS liner wraps around the source-drain epitaxy contacts, including bottom negatively tapered surfaces of the source-drain epitaxy contacts.

18 Claims, 12 Drawing Sheets

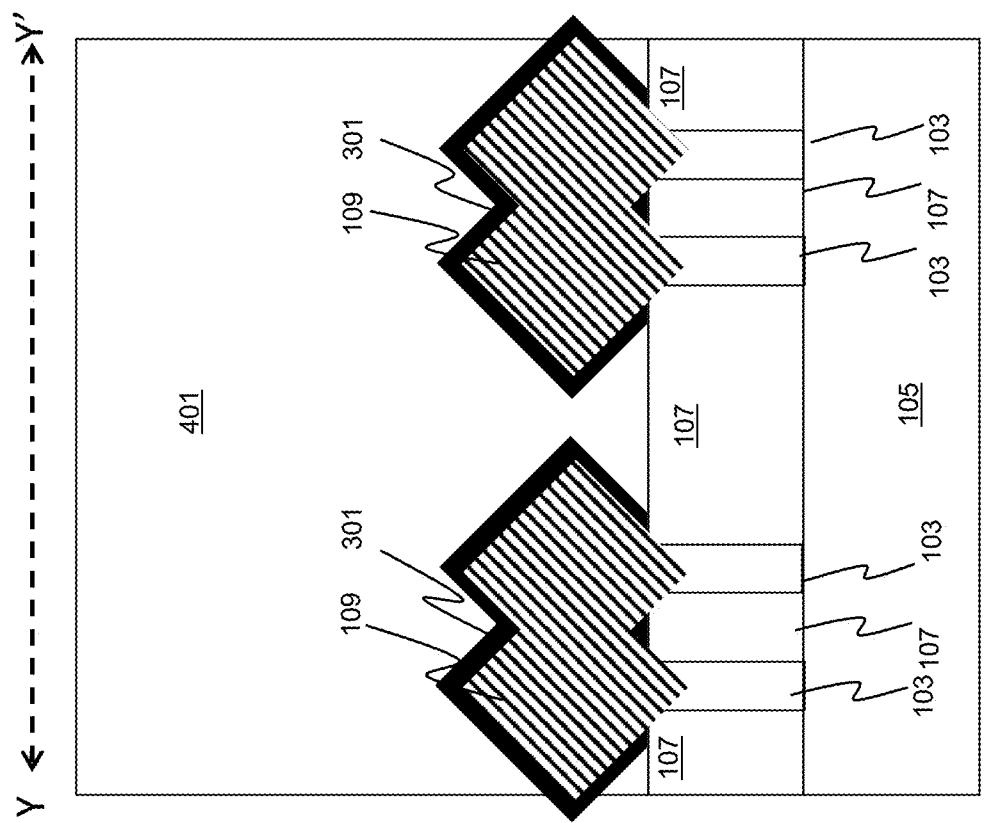
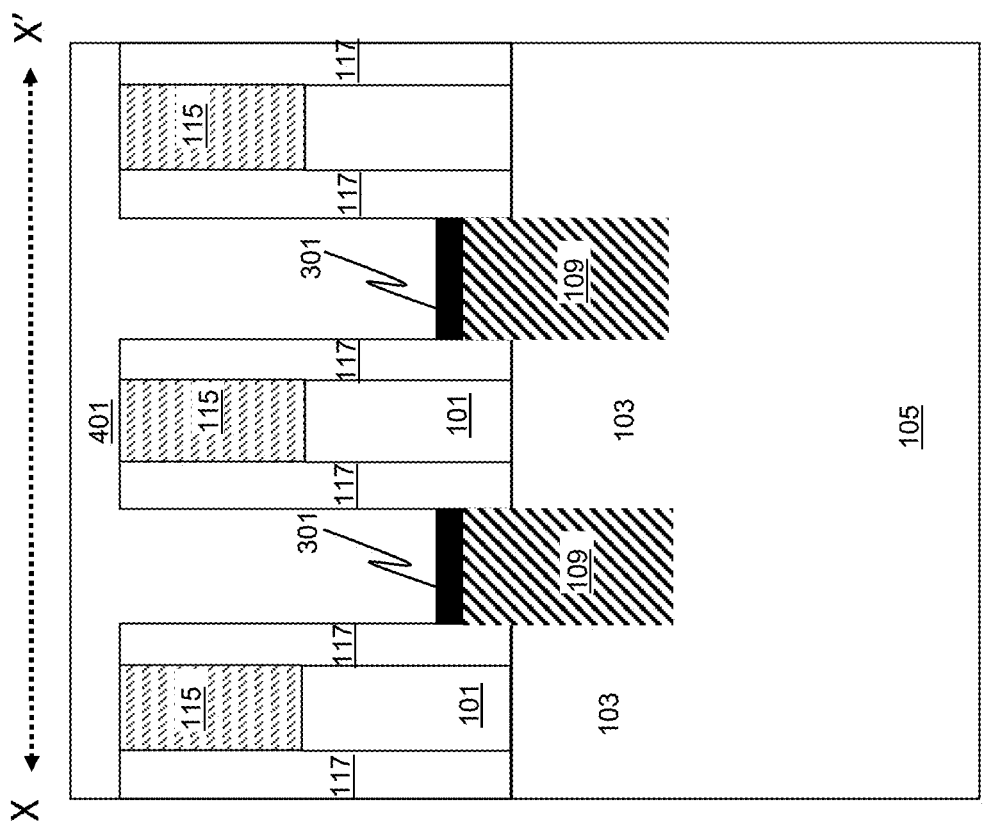
FIG. 4B
FIG. 4A

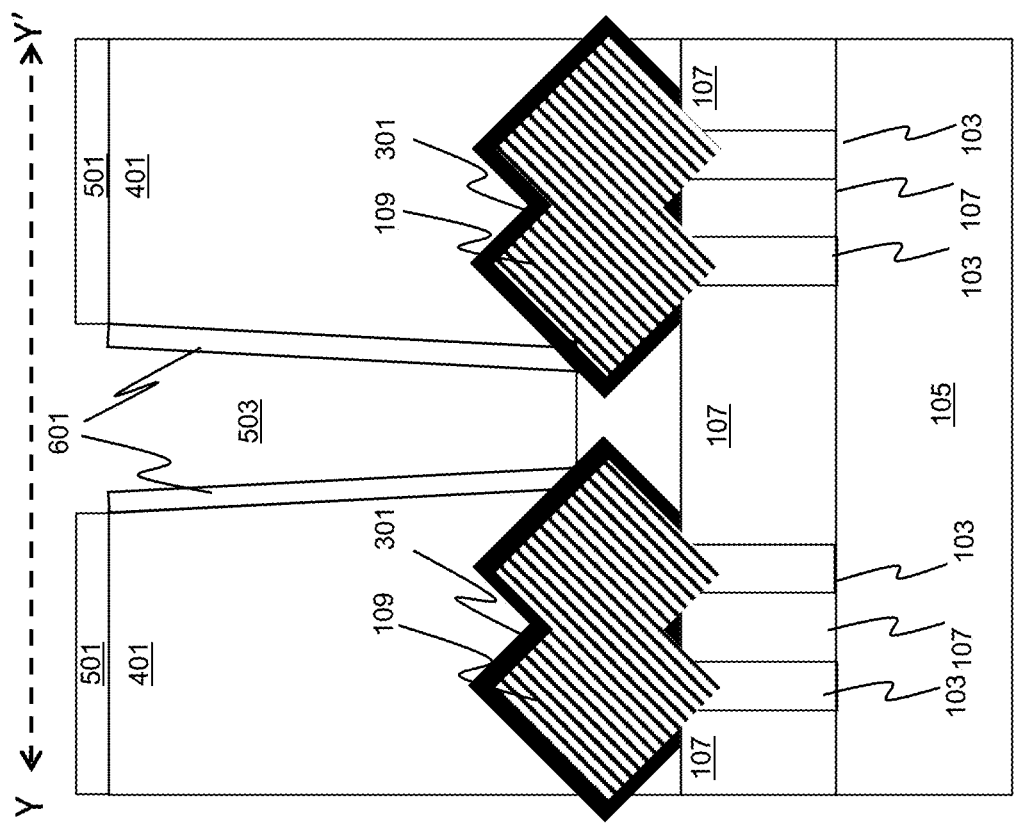
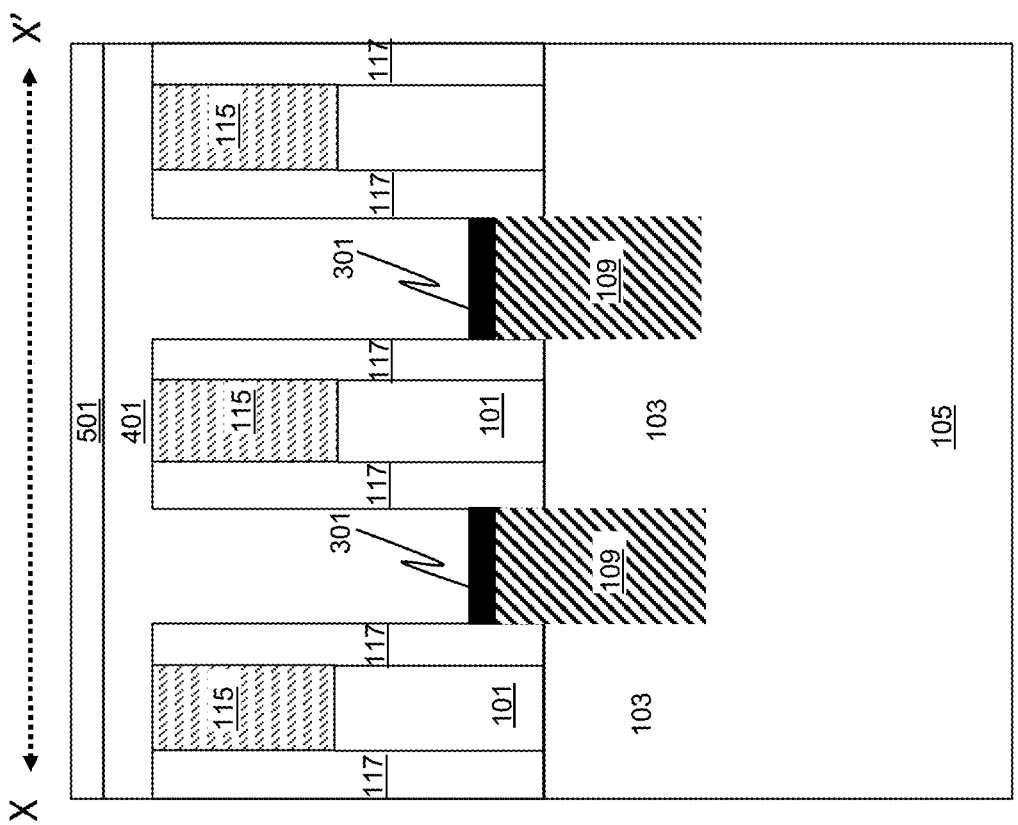
FIG. 6A
FIG. 6B

METHOD OF FORMING WRAP-AROUND-CONTACT AND THE RESULTING DEVICE

TECHNICAL FIELD

The present disclosure relates to a wrap-around-contact (WAC), e.g., formed in a fin field-effect transistor (FinFET), and method of forming the WAC.

BACKGROUND

Trench silicide (TS) liner coverage of a source-drain epitaxy as a WAC to reduce spreading resistance is critical for designing advanced semiconductor devices. Attempts have been made where a sacrificial cap (e.g., silicon germanium (SiGe 85%) is selectively grown on a source-drain epitaxy. However, germanium (Ge) diffusion occurs from the source-drain epitaxy into the sacrificial cap during HK reliability annealing making selective SiGe 85% removal challenging.

A need therefore exists for a device with an improved TS liner wrapping around the source-drain epitaxy that reduces the risk of spreading resistance and eliminates Ge diffusion issues, and a related method of making the device.

SUMMARY

An aspect of the present disclosure is a logic or memory cell having a TS liner between a dielectric and TS contacts negatively tapered towards a bottom portion of a self-aligned trench cut.

Another aspect of the present disclosure is a process for forming a logic or memory cell with a TS liner wrapping around source-drain epitaxy contacts, including a bottom portion of the source-drain epitaxy contacts.

According to the present disclosure, some technical effects may be achieved in part by a device including: a gate structure formed over a substrate, the gate structure including a HKMG, a gate cap disposed over the HKMG, and gate sidewall spacers. Source-drain epitaxy contacts include a TS liner covering the source-drain epitaxy contacts. TS contacts are formed on the TS liner over the source-drain epitaxy contacts. A dielectric pillar is disposed in a TS cut between the source-drain epitaxy contacts. The TS liner is further formed between the dielectric pillar and the TS contacts, and the TS liner wraps around the source-drain epitaxy contacts, including bottom negatively tapered surfaces of the source-drain epitaxy contacts.

Another aspect of the present disclosure is a device including a gate structure formed over a substrate. Source-drain epitaxy contacts include a TS liner covering the source-drain epitaxy contacts. TS contacts are formed on the TS liner over the source-drain epitaxy contacts. A dielectric pillar is disposed in a TS cut between the source-drain epitaxy contacts. The TS liner wraps around the source-drain epitaxy contacts, including bottom negatively tapered surfaces of the source-drain epitaxy contacts.

A further aspect of the present disclosure is a method including forming a gate structure over a substrate. The gate structure includes a HKMG, a gate cap disposed over the HKMG, and gate sidewall spacers. Source-drain epitaxy contacts are formed. A sacrificial cap layer is formed over the source-drain epitaxy contacts. An OPL is formed over the substrate. A trench is formed in the OPL down to the sacrificial cap layer, wherein the trench is formed over a STI region in the substrate. A sidewall spacer is formed on sides of the trench. A portion of the OPL located between an upper surface of the STI and sacrificial cap layer is removed. A dielectric pillar is formed in the trench. Any remaining OPL is removed and the sacrificial cap layer is removed. A TS liner is formed over exposed surfaces of the source-drain epitaxy contacts. TS contacts are formed on the TS liner over the source-drain epitaxy contacts.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems associated with the formation of a TS liner wrapping around source-drain epitaxy to minimize spreading resistance and avoid Ge diffusion. The problems are solved, inter alia, by forming a sacrificial cap layer around the source-drain epitaxy (including a bottom portion) and then replacing the sacrificial cap layer with a TS liner.

Devices in accordance with embodiments of the present disclosure include a gate structure formed over a substrate; source-drain epitaxy contacts including a TS liner covering the source-drain epitaxy contacts; TS contacts formed on the TS liner over the source-drain epitaxy contacts; and a dielectric pillar disposed in a TS cut between the source-drain epitaxy contacts. The TS liner wraps around the source-drain epitaxy contacts, including bottom negatively tapered surfaces of the source-drain epitaxy contacts.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
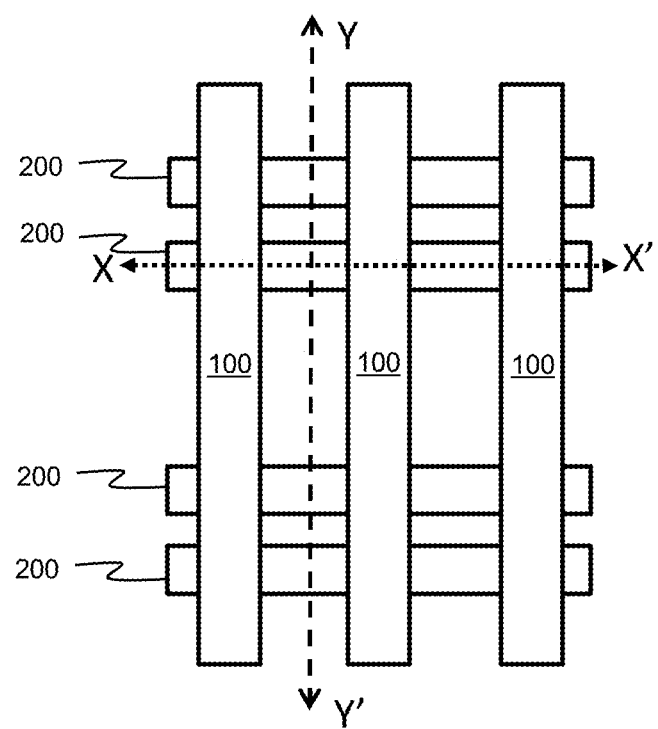
FIG. 1A schematically illustrates a top view of a logic or memory cell, in accordance with an exemplary embodiment.
Figure 1C:
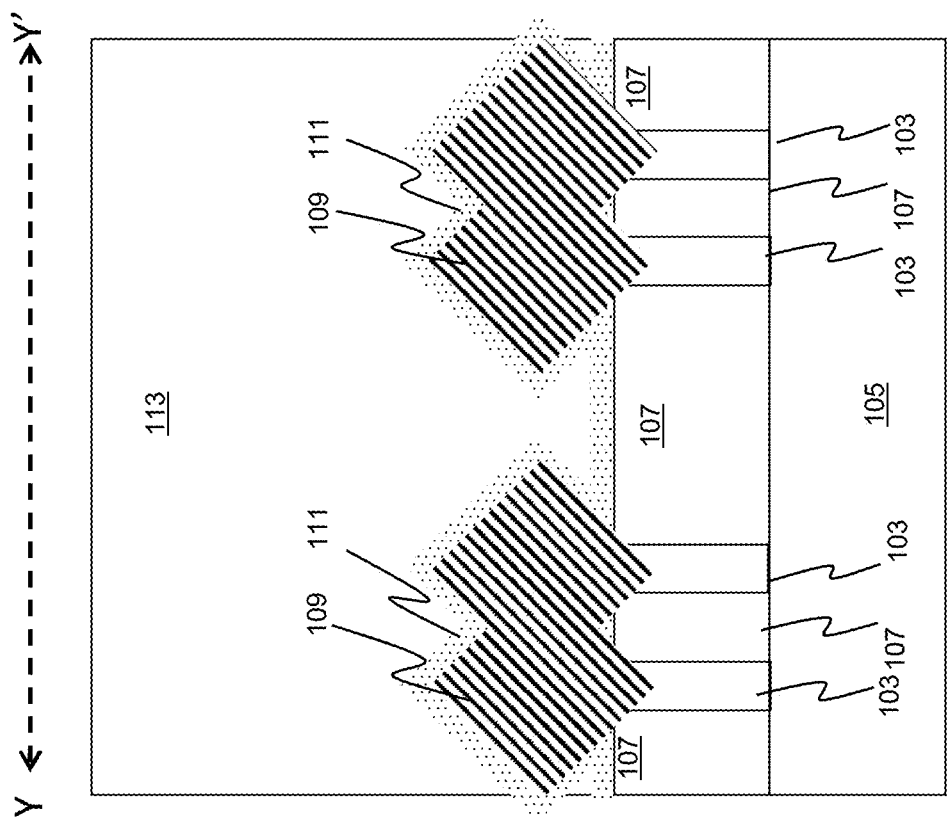
FIG. 1C schematically illustrates a cross-sectional view along a cut line Y-Y' of FIG. 1A.
Figure 1B:
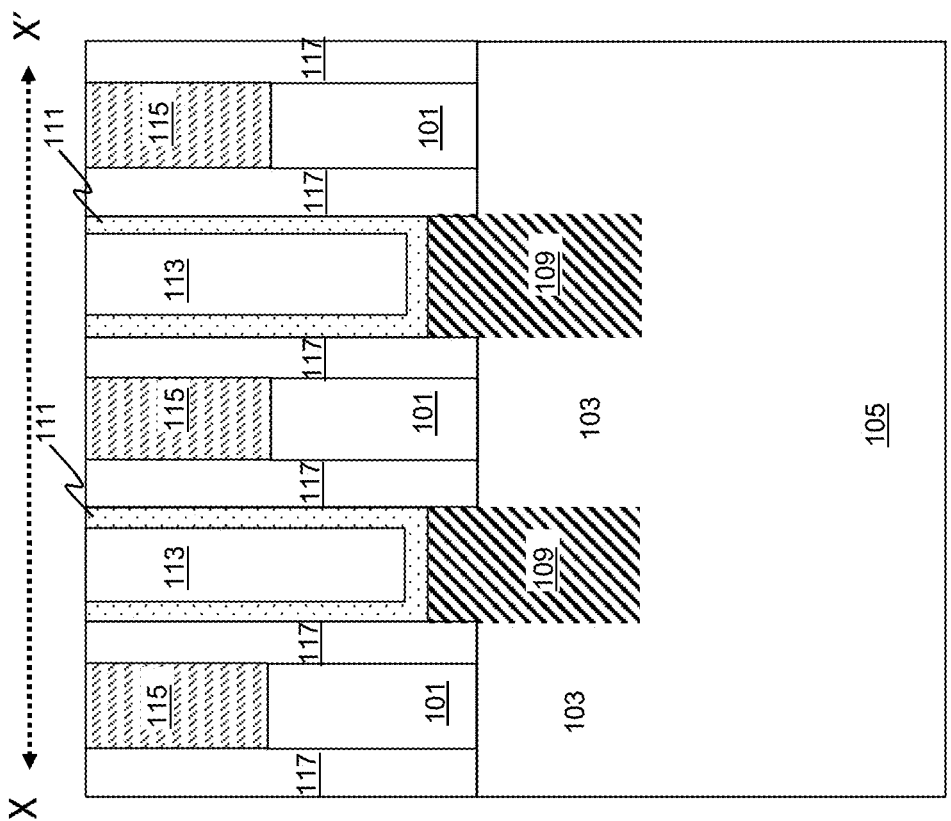
FIG. 1B schematically illustrates a cross-sectional view along a cut line X-X' of FIG. 1A.

FIG. 1A schematically illustrates a top view of a logic or memory cell with gate region 100 and fin region 200. FIG. 1B schematically illustrates a cross-sectional view across gates in fin region 200 along a cut line X-X' of FIG. 1A. FIG. 1C schematically illustrates a cross-sectional view across fins in a source-drain region along a cut line Y-Y' of FIG. 1A, in accordance with an exemplary embodiment. Referring to FIG. 1A, gate structures in the gate region 100 of a logic or memory cell may be, for example, replacement metal gate (RMG) structures with gates across and perpendicular to previously formed semiconductor fins 103 and a bulk semiconductor substrate 105. The RMG process begins with dummy gate structures to self-align the source and drain implant, and then strips out the dummy gate structures and replaces them with the HKMG materials, which are shown in FIGS. 1A-11B.

As shown in FIG. 1C, fins 103 are formed on substrate 105 to extend upward therefrom, and a shallow trench isolation (STI) region 107 is formed on substrate 105 between fins 103. Referring back to FIG. 1B, each dummy gate structure is formed above STI 107 and adjacent to a pair of fins 103 at a respective channel region.

Referring to FIG. 1B, a gate sidewall spacer 117 is then formed around each dummy gate structure, using known techniques, for example, depositing a dielectric spacer material layer conformally around each dummy gate structure and then performing an anisotropic etch process to remove the dielectric spacer material from horizontal surfaces of each dummy gate structure and STI 107. The remaining vertical portion of the dielectric spacer material layer on the sidewalls of each dummy gate structure becomes gate sidewall spacers 117.

Source-drain epitaxy contacts 109 are then formed, e.g., by epitaxy growth, on edges of fins 103 between the dummy gate structures. Referring to FIG. 1C, source-drain regions are formed in exposed portions of fins 103 to be adjacent to a respective channel region such that the channel region is positioned laterally between the source-drain recesses. Source-drain epitaxy contacts 109 are then formed, for example, using an epitaxial semiconductor deposition process. In one instance, source-drain epitaxy contacts 109 may be formed of silicon containing phosphorus (Si:P) in an n-type FET, or silicon germanium doped with boron (SiGe:B), Ge % [30-50%] in a p-type FET.

Thereafter, as shown in FIG. 1C, a contact etching stop layer (CESL) liner 111 is deposited conformally on source-drain epitaxy contacts 109. CESL liner 111 is formed, e.g., of silicon nitride ($Si_3N_4$), low-k dielectric materials like silicon-carbon-boron-nitrogen (SiCBN), silicon oxycarbide (SiOC) or silicon-carbon-oxynitride (SiCON), over and between source-drain epitaxy contacts 109. Next, an inter-layer dielectric (ILD) 113, e.g., silicon dioxide ($SiO_2$) or any other material with similar functional properties, is formed, e.g., by chemical vapor deposition (CVD), over source-drain epitaxy contacts 109, CESL liner 111, and between dummy gate structures.

Next, each dummy gate structure is selectively removed to provide a gate opening that exposes a channel region. An RMG typically includes one or more gate dielectric layers and one or more metal layers deposited onto the gate dielectric layers so as to fill gate openings. The materials and thicknesses of the dielectric and metal layers of the RMG are selected based on work functions and FET conductivity types. For example, the final HKMG stack 101 includes an inter-layer (IL) oxide and a high-k gate dielectric layer. The high-k gate dielectric layer may be formed of a dielectric material with a dielectric constant that is greater than 3.9, e.g., hafnium (IV) oxide ($HfO_2$), zirconium dioxide ($ZrO_2$) or any other material with similar functional properties. The layers within the HKMG stack 101 are not illustrated in the drawings for simplification. Techniques for selective removal of dummy gate structures and forming the final HKMG stack 101 are known in the art and omitted from this specification in order to allow the reader to focus on the salient aspects of the disclosed methods.

A polishing process (e.g., a chemical mechanical polishing (CMP) process) may be performed to remove all gate materials from above the top surfaces of CESL liner 111 and ILD material layer 113. Then, HKMG stack 101 is recessed (i.e., etched back) within the gate openings. A dielectric gate cap layer can be deposited over the partially completed structure and followed with another polishing process (e.g., a CMP process) to remove the dielectric gate cap layer from above the top surfaces of CESL liner 111 and ILD material layer 113 thereby forming a gate cap 115 on each RMG that includes HKMG stack 101, gate cap 115, and gate sidewall spacer 117 as depicted in FIGS. 1B-1C.

Figure 2A:
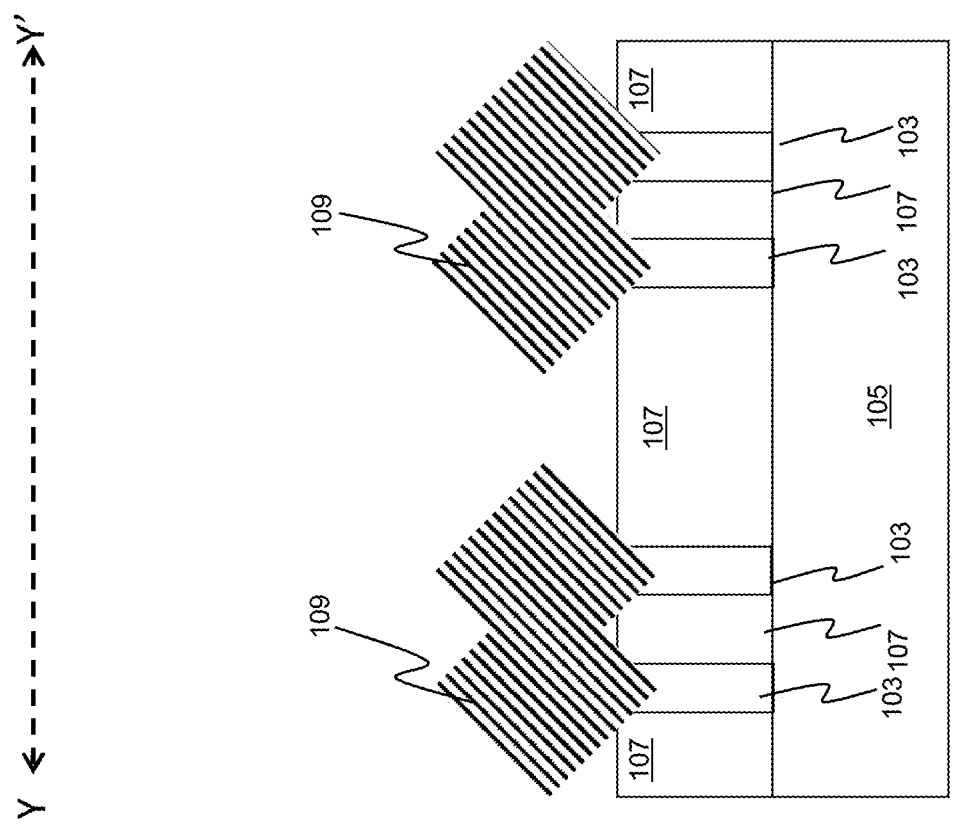
FIGS. 2A-2B through 11A-11B, respectively, schematically illustrate cross-sectional views of a process flow for forming a logic or memory cell device having a source-drain epitaxy (including a bottom portion) wrapped around by a TS liner along the cut lines X-X' and Y-Y', in accordance with exemplary embodiments.
Figure 2B:
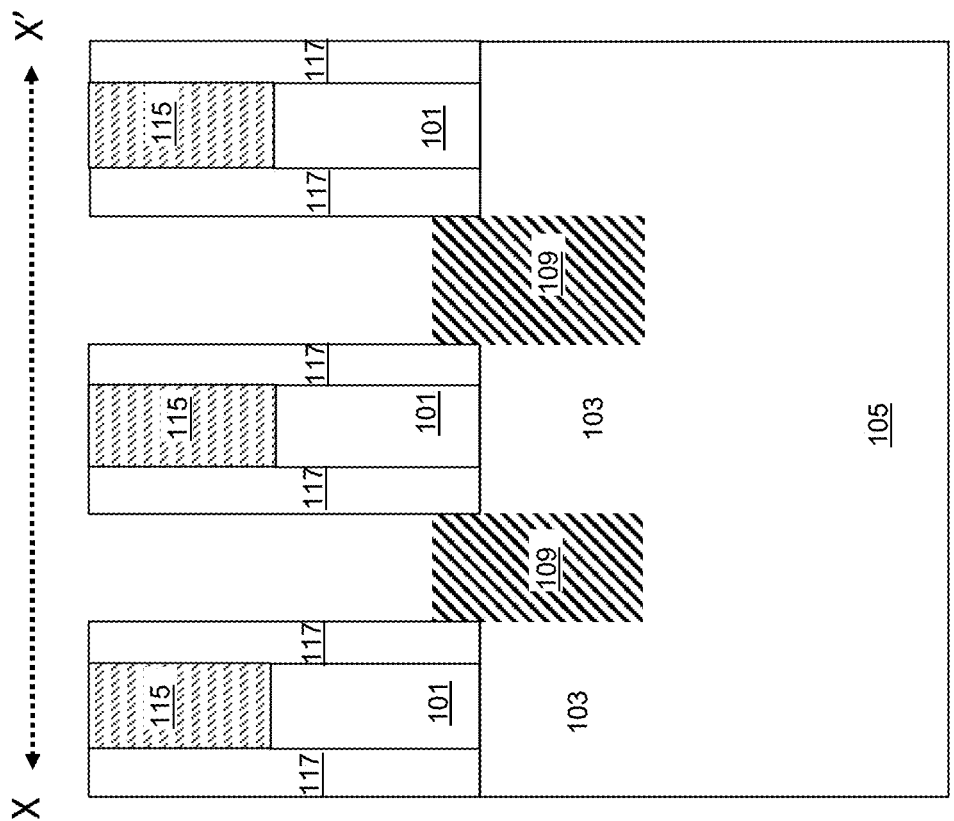

FIGS. 2A-2B through 11A-11B, respectively, schematically illustrate cross-sectional views of a process flow for forming a logic or memory cell device having a source-drain epitaxy (including a bottom portion) wrapped around by a TS liner along the cut lines X-X' and Y-Y', in accordance with the exemplary embodiment. Referring to FIGS. 2A-2B, the ILD 113 is removed, e.g., by an isotropic etch process such as wet hydrofluoric (HF) acid etch or any other similar etching process, and the CESL liner 111 is removed, e.g., by an isotropic etch process such as wet phosphoric acid ($H_3PO_4$) etch or any other similar etching process.

Figure 3B:
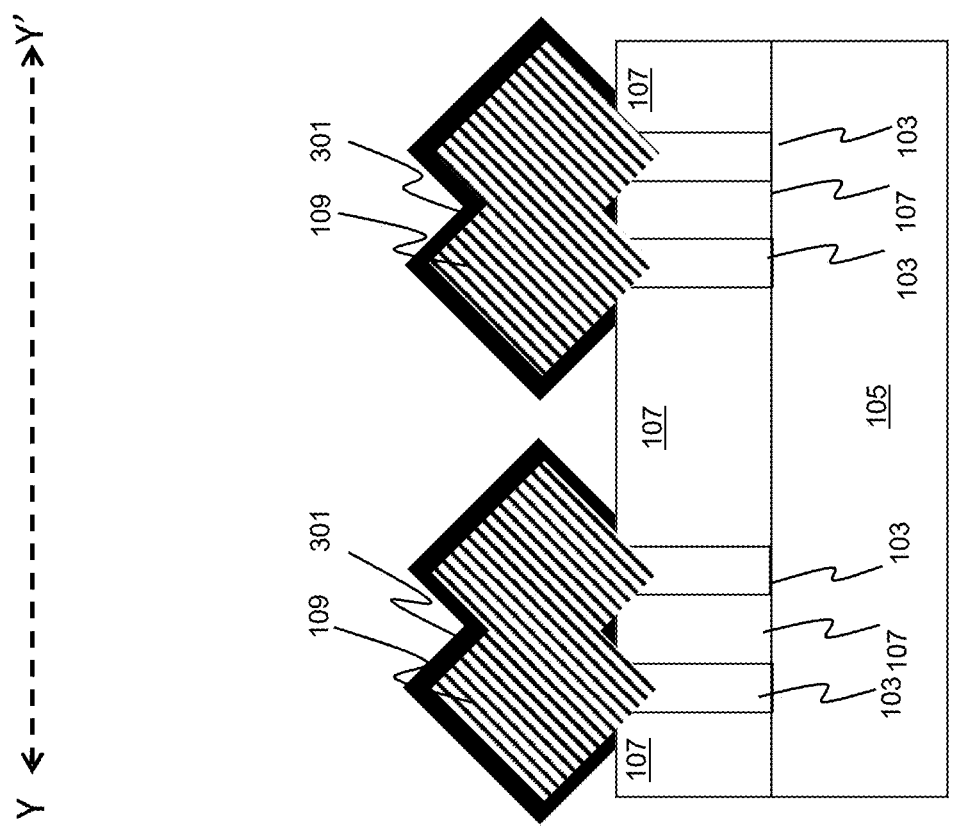
Figure 3A:
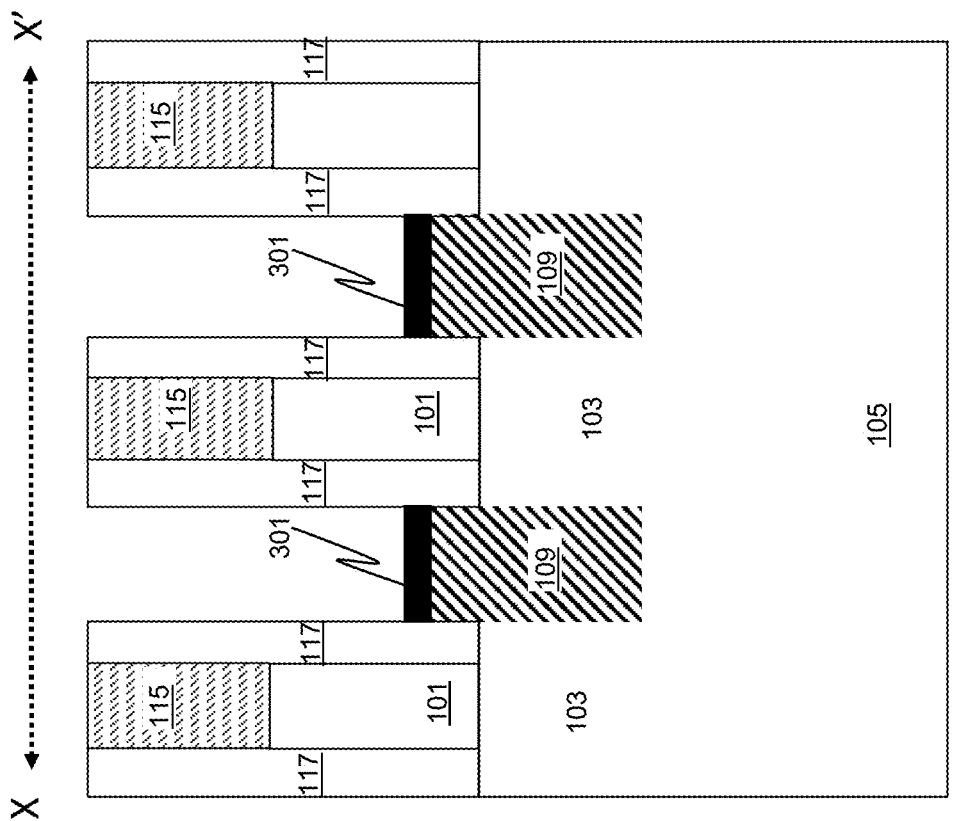

As shown in FIGS. 3A-3B, a sacrificial cap layer 301 is formed, e.g., by selectivity etching, over source-drain epitaxy contacts 109. In one embodiment, the sacrificial cap layer 301 is formed using low temperature (e.g., in a range of about 400° C. to about 500° C.) epitaxy growth to control the cap layer thickness with a low thermal budget process. As a result, (1) Ge diffusion in source-drain epitaxy contacts 109, and (2) metal inter-diffusion in HKMG stack 101 are prevented, and thus, the integrity of HKMG stack 101 is preserved.

The sacrificial cap layer 301 is selectivity etched to reach a contact interface with source-drain epitaxy contacts 109, without etching source-drain epitaxy contacts 109. For the pFET polarity, the sacrificial cap layer 301 may be formed of silicon germanium (SiGe) Ge % [85-100%] or pure Si grown on SiGe:B source-drain epitaxy contacts 109. For the nFET polarity, the sacrificial cap layer 301 may be formed of silicon germanium (SiGe) Ge % [85-100%] grown on Si:P source-drain epitaxy contacts 109. In another embodiment, sacrificial cap layer 301 of Ge may be selectively grown without diffusion, thereby avoiding Ge diffusion issues caused by high-temperature thermal annealing.

Referring to FIGS. 4A-4B, an OPL 401 is deposited on the structure as a patterning layer. In accordance with an embodiment of the present invention, the OPL 401 may be an organic polymer including carbon, hydrogen and nitrogen. Non-limiting examples of the OPL 401 include JSR HM8006, JSR HM8014, AZ UM10M2, Shin Etsu ODL 102, or other similar commercially available materials from such vendors as JSR, TOK, Sumitomo, Rohm & Haas, etc. The OPL 401 can be deposited, for example, by spin coating and excess OPL 401 is etched back.

Figure 5A:
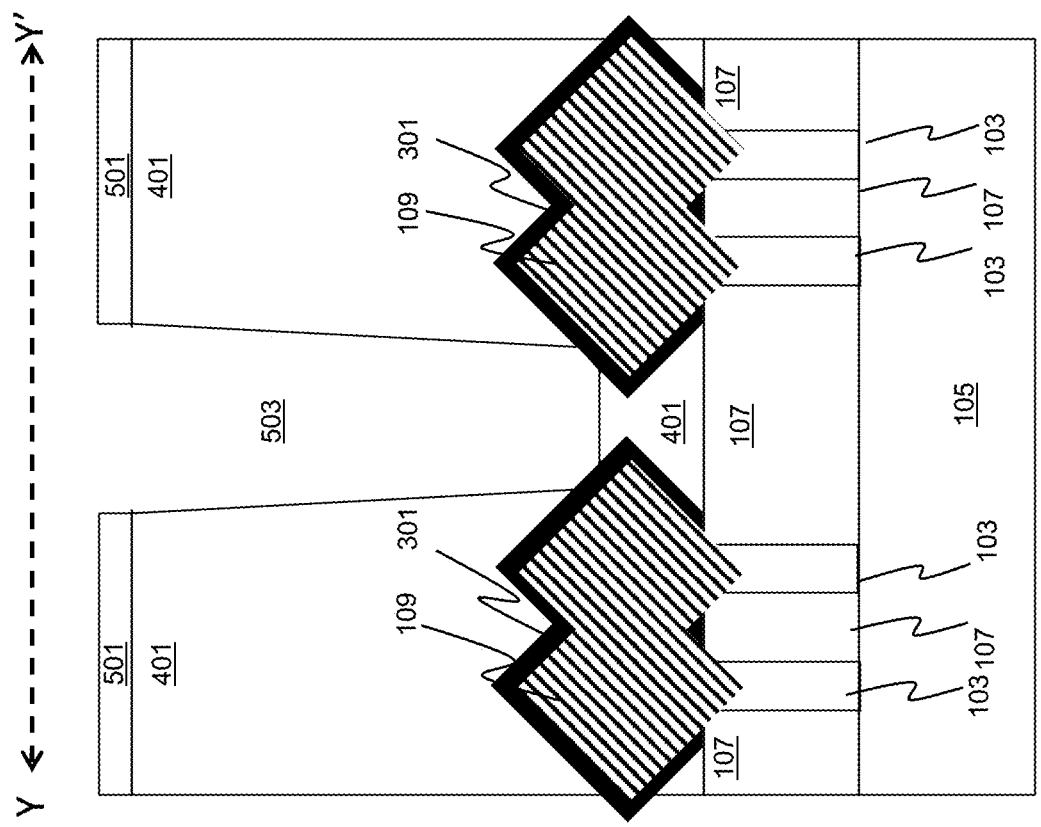
Figure 5B:
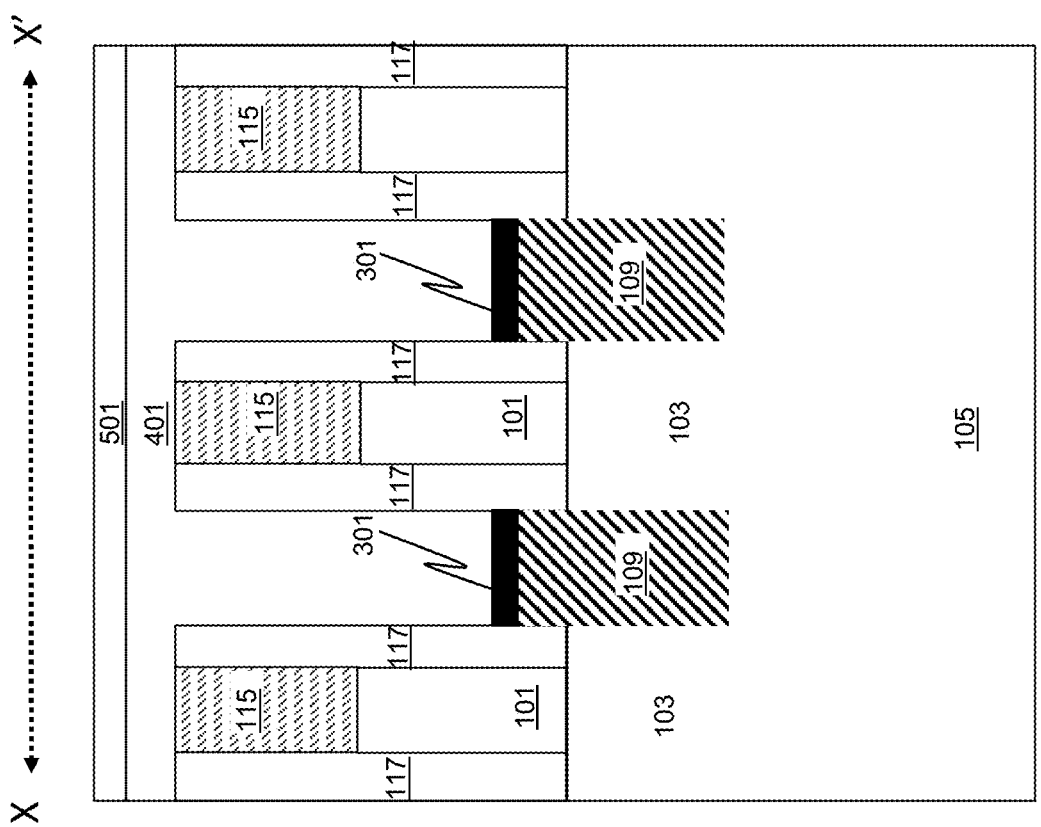

In FIGS. 5A-5B, an anti-reflection layer 501, e.g., of titanium dioxide ($TiO_2$), silicon-based anti-reflective coating (SiARC), low-temperature silicon oxide (LTO), silicon oxynitride (SiON) or any other material with similar functional properties, along with a photoresist stack (not shown) is deposited on the OPL 401. After patterning lithography, a trench 503 is formed in the OPL layer 401 by reactive ion etching (ME) or any other similar etching processes in the active region of the device. At this stage, the RIE stops upon reaching the sacrificial cap layer 301 grown on source-drain epitaxy contacts 109. Referring to FIG. 5B, the ME stops at a lower portion of the upper surface of the diamond-shaped source-drain epitaxy contacts 109, instead of etching all the way down to STI 107.

As shown in FIGS. 6A-6B, a sidewall spacer 601, e.g., SiN or any other material with similar functional properties, is formed, e.g., by conformally depositing $Si_3N_4$ using, for example, a via plasma-enhanced atomic layer deposition (PEALD) or any other similar deposition processes compatible with OPL layer 401, on the sidewalls of trench 503. A directional ME (anisotropic) is performed and maintains sidewall spacer 601 on the side walls of the trench 503 and removes it at the bottom of the trench 503 and at the top of anti-reflection layer 501.

Figure 7B:
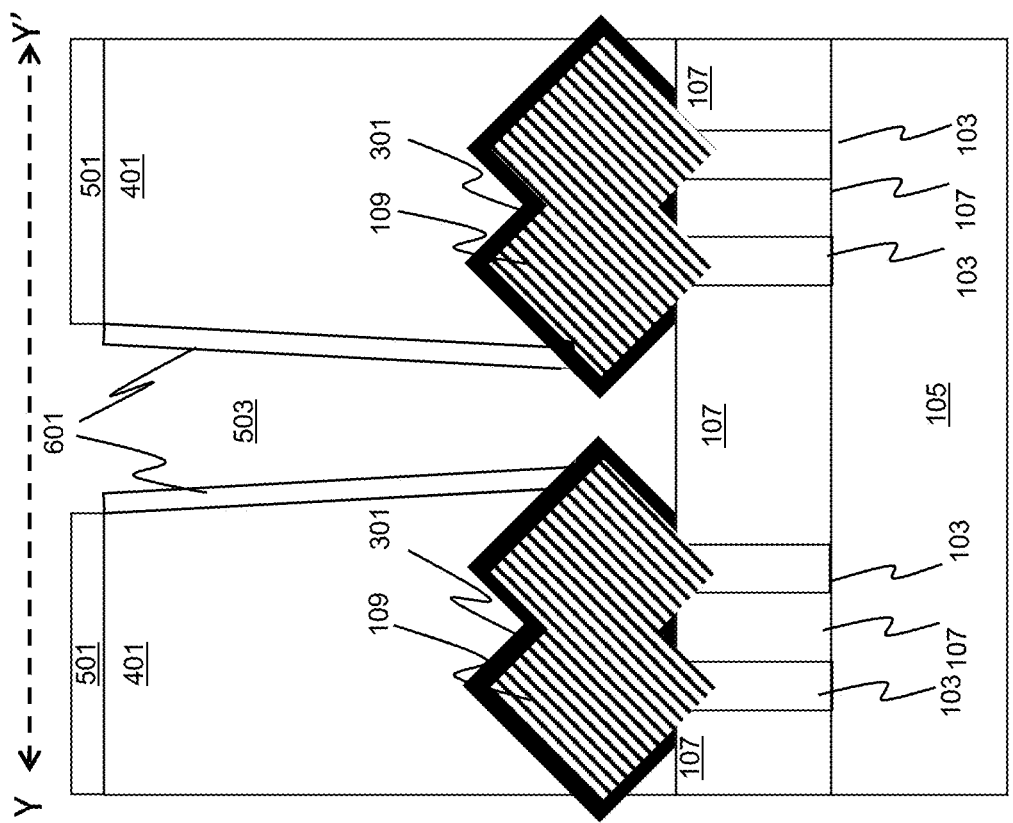
Figure 7A:
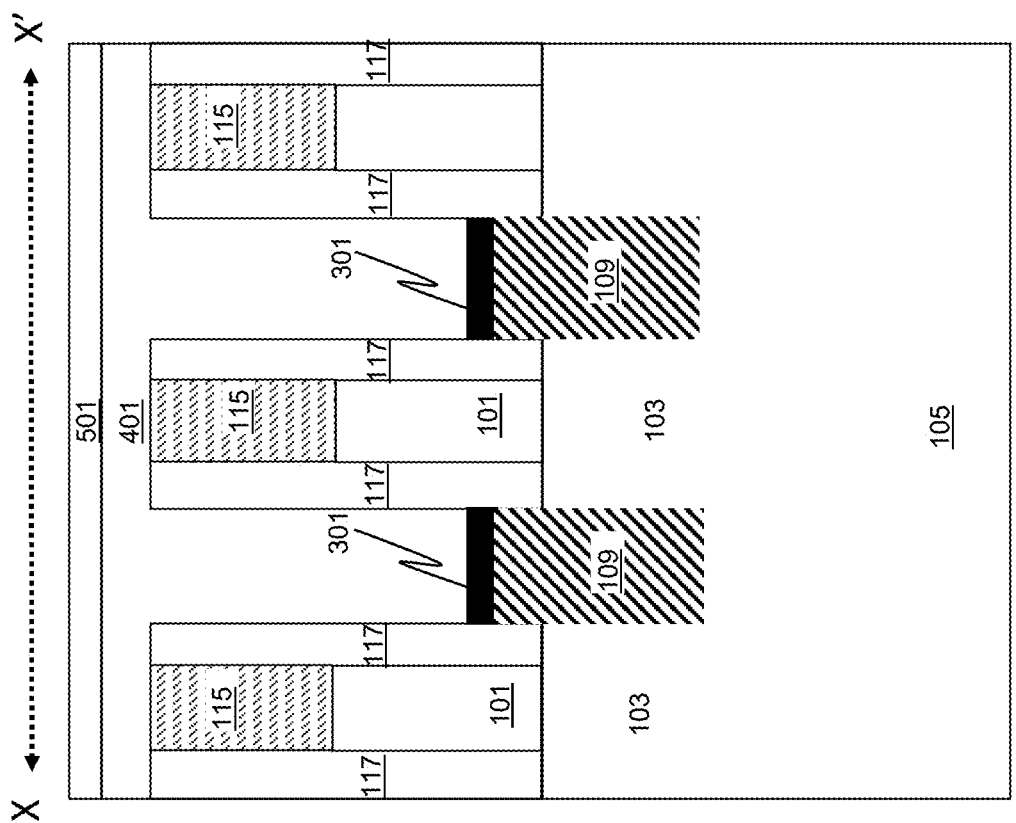

In FIGS. 7A-7B, OPL layer 401 remaining at the bottom of the trench 503 is etched selectively to anti-reflection layer 501, sidewall spacer 601 and sacrificial cap layer 301 until reaching the upper surface of STI layer 107. The etch can be hybrid in nature with an anisotropic component such as a directional RIE process, as well as an isotropic component such as an ash process.

Figure 8B:
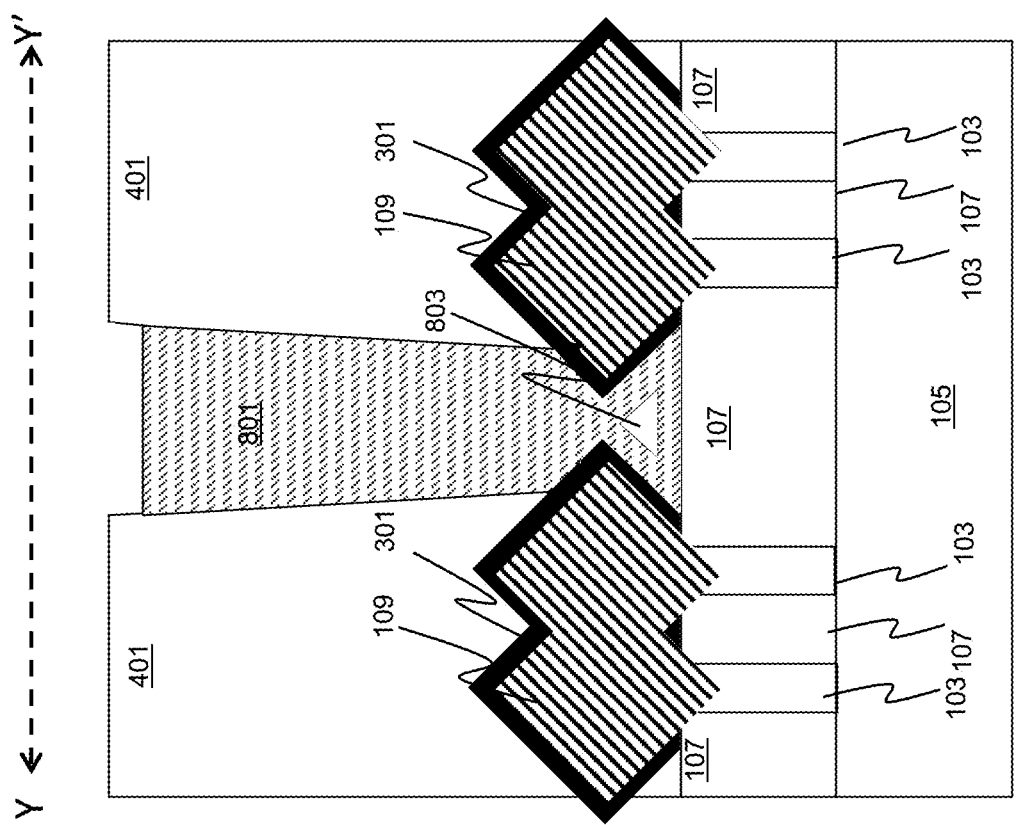
Figure 8A:
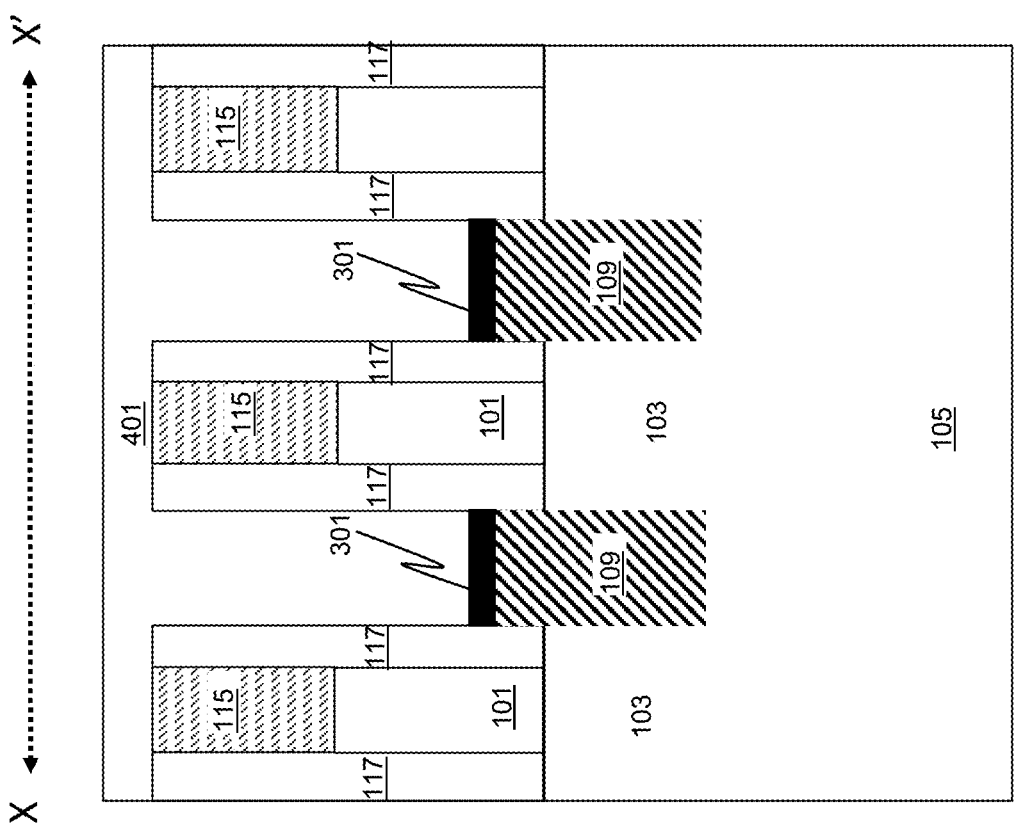

As shown in FIGS. 8A-8B, the anti-reflection layer 501 is removed from the top surface of OPL 401 while the sidewall spacer 601 is stripped from the sidewalls of OPL 401 in the trench 503. Further, a dielectric liner is conformally deposited on the structure with a thickness sufficient to ensure a complete pinch-off of the trench 503 thus forming a dielectric pillar 801. The dielectric liner conformally deposited to form dielectric pillar 801 can be $Si_3N_4$ or low-k dielectric materials such as SiCBN, SiOC, SiCON or any other material with similar functional properties. The pinch-off mechanism of the trench 503 by the conformal dielectric liner can trigger the encapsulation of an air-gap or void 803 in the negatively tapered region of the source-drain epitaxy contacts 109 depending on the geometry of the source-drain epitaxy contacts 109 and sacrificial cap layer 301 relative to the trench 503. The air-gap or void 803 encapsulated at the bottom of the dielectric pillar 801 provides additional reduction of the parasitic capacitance between adjacent source-drain regions and improves the electrical performance of the device. Next, an isotropic etch process is performed to selectively remove the dielectric pillar 801 from the top surface of OPL layer 401.

Figure 9B:
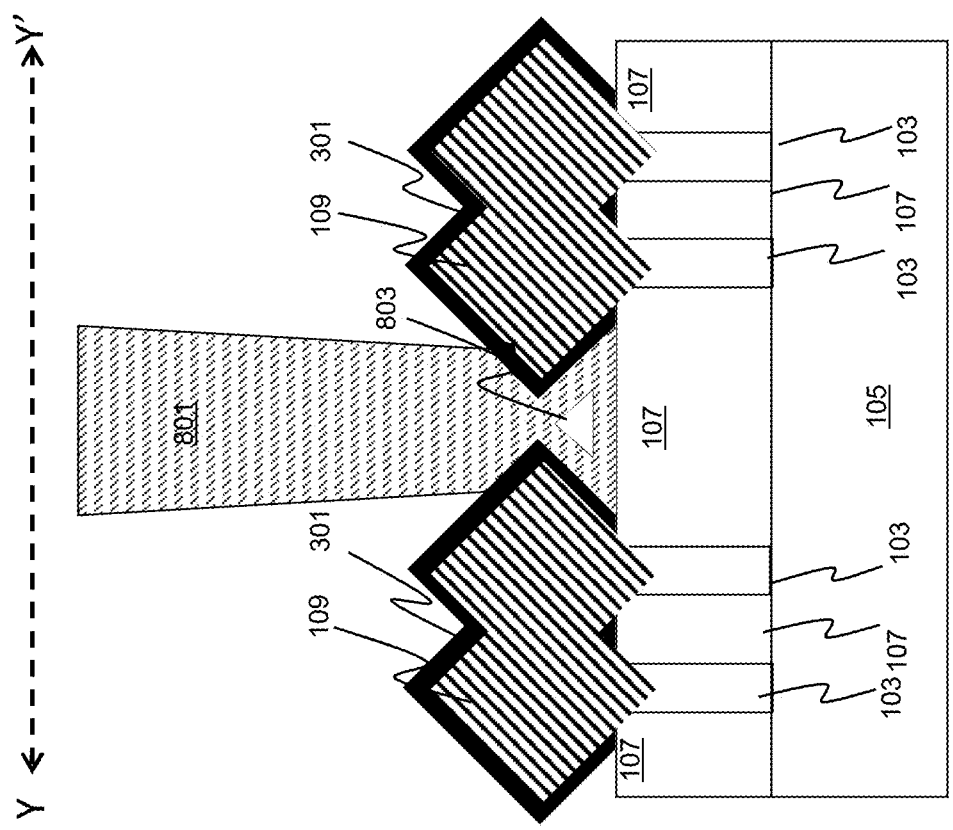
Figure 9A:
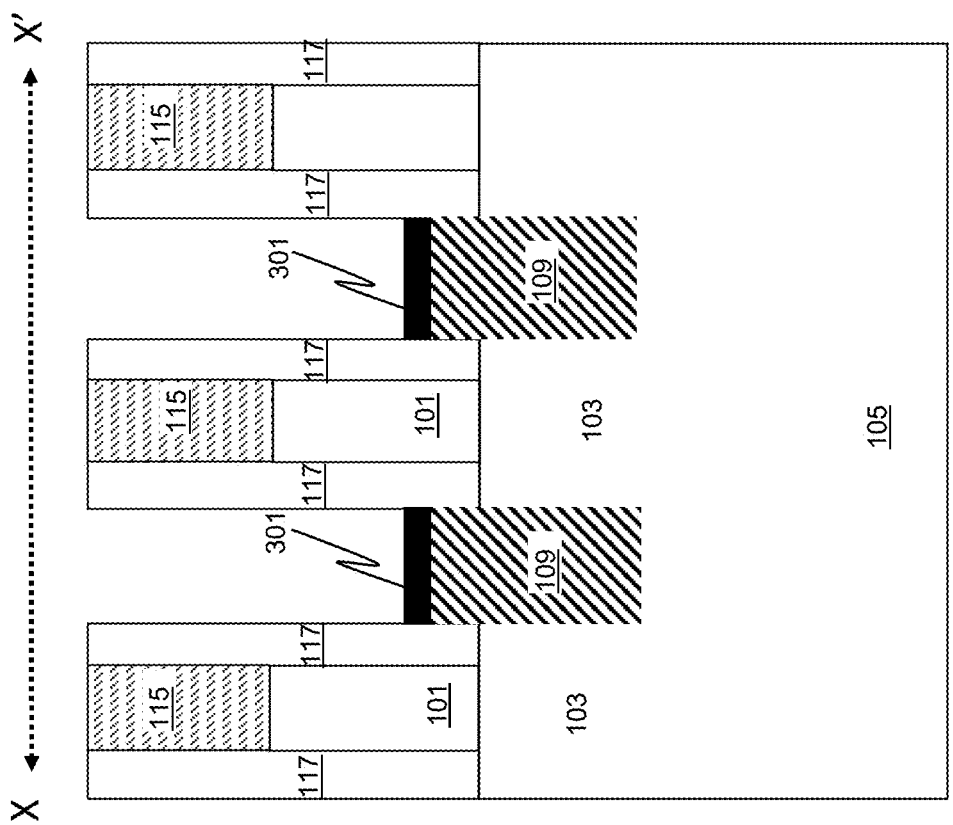

As illustrated in FIGS. 9A-9B, the OPL 401 is removed selectively to the rest of the integrated structure by an ashing process or similar etching processes, thereby leaving the dielectric pillar 801 vertically standing and anchored at the bottom by the source-drain epitaxy 109 contacts/sacrificial cap layer 301 and STI 107.

Figure 10B:
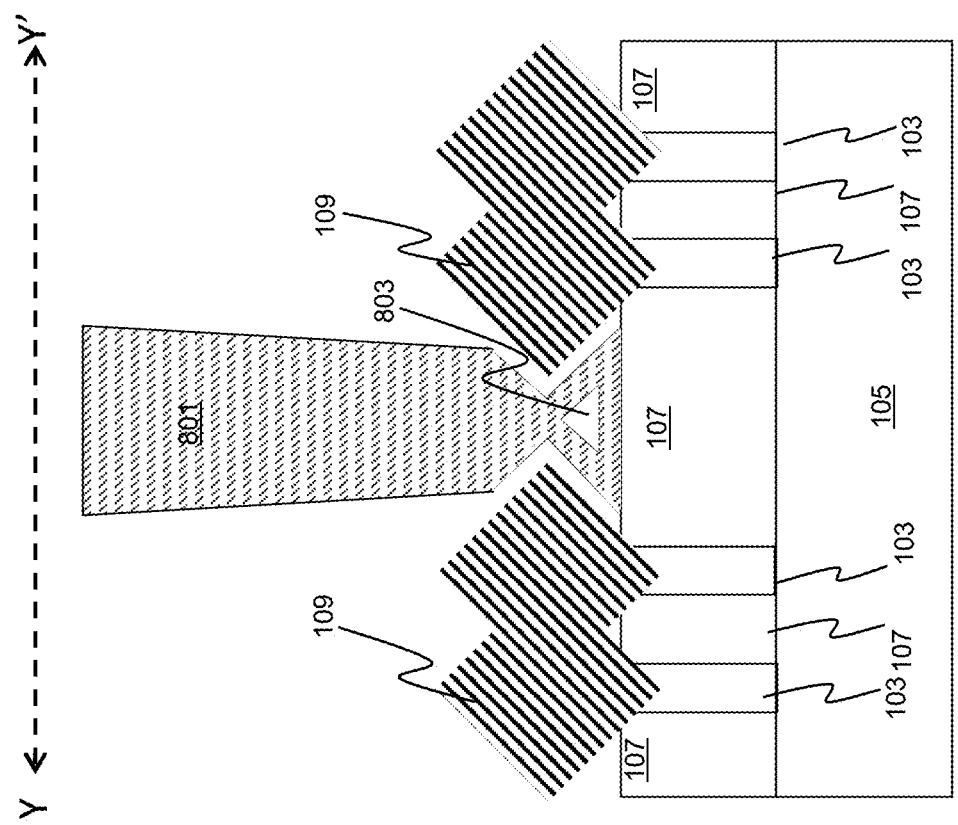
Figure 10A:
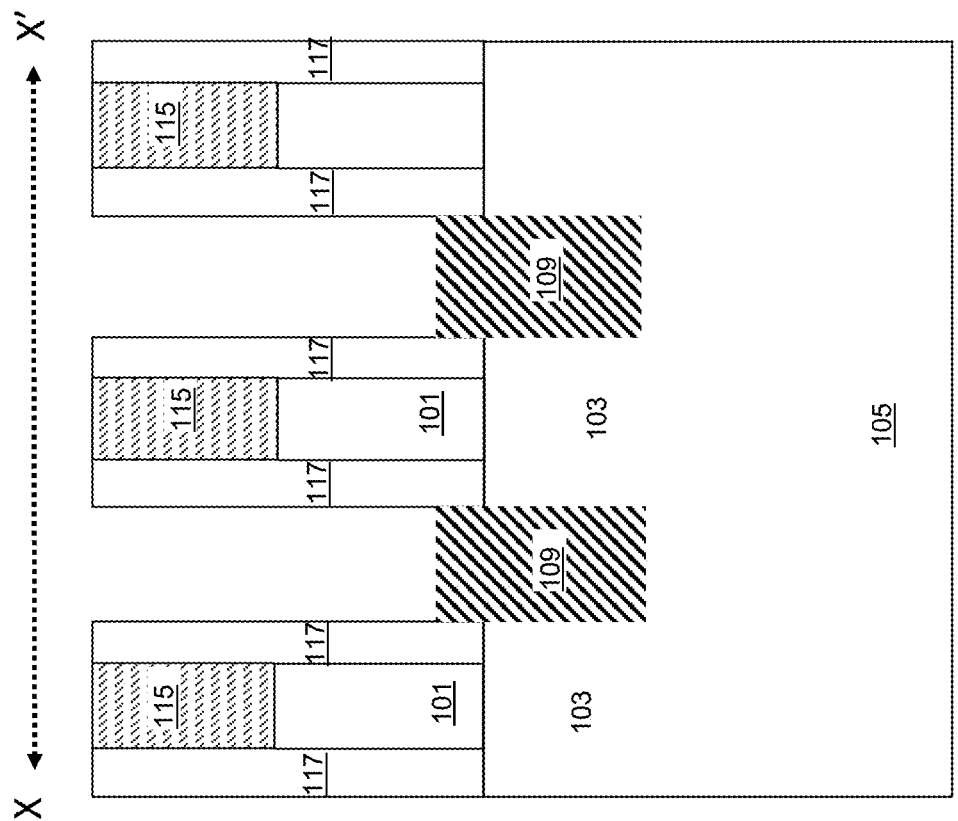

In FIGS. 10A-10B, the sacrificial cap layer 301, e.g., SiGe85%, is etched selectively to the source-drain epitaxy contacts 109, dielectric pillar 801 and STI 107. Techniques such as, but not limited to, vapor phase hydrogen chloride (HCl) gas or chlorine trifluoride ($ClF_3$) gas can be employed for the selective removal of sacrificial cap layer 301.

Figure 11B:
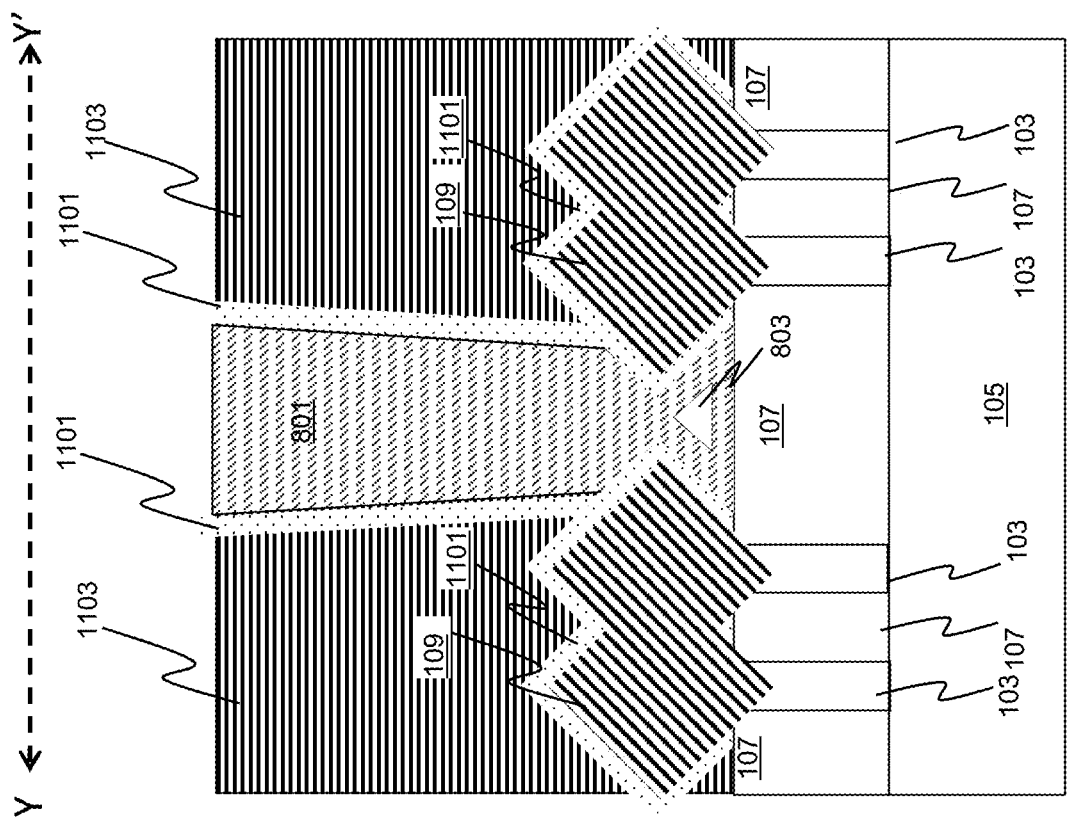
Figure 11A:
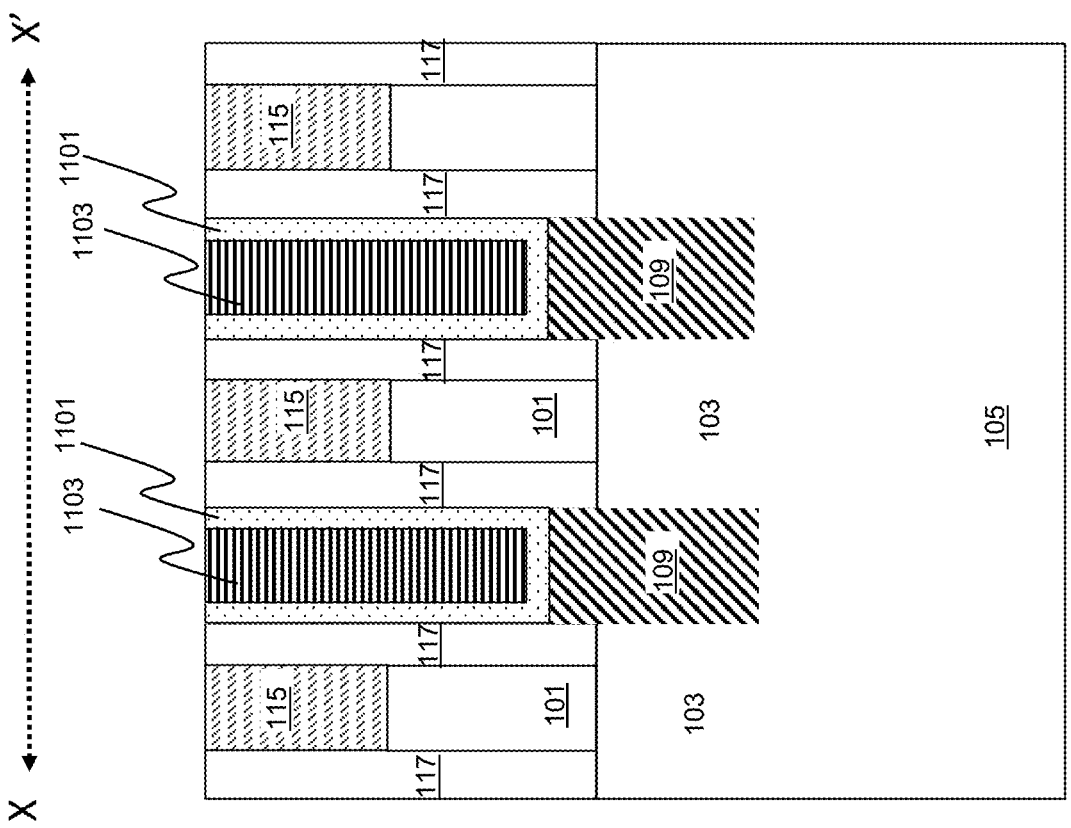

In FIGS. 11A-11B, a TS liner 1101 wrapping around the source-drain epitaxy contacts 109 is formed by conformal deposition of a Ti liner using CVD followed by an annealing step to form a titanium silicide. The thickness of the TS liner is sufficient to ensure pinch-off of the region between source-drain epitaxy contacts 109 and the dielectric pillar 801. In one embodiment, the thickness of the TS liner ranges from 2 nm to 5 nanometers (nm). Further, TS contacts 1103 are formed by a metallization process. In one embodiment, the TS contacts 1103 are formed by depositing tungsten (W), cobalt (Co), or ruthenium (Ru). In one instance, materials for silicide liner 1101 may be selected to match the materials of TS contacts 1103, e.g., when TS contacts 1103 is formed of W, the TS liner 1101 may be formed of titanium (Ti). In this instance, TS liner 1101 wraps around the source-drain epitaxy contacts 109, including the bottom negatively tapered regions. In the final structure, the TS contacts 1103 exhibit a negative tapered shape as a by-product of the cut trench process.

The embodiments of the present disclosure can achieve several technical effects including a TS liner wrapping around source-drain epitaxy (including its bottom) and a trench cut filled with a dielectric having a negative tapered shape thus avoiding a thin and weak trench silicide layer formed by annealing at the bottom of the source-drain epitaxy. In certain embodiments, a void or airgap is left at the bottom portion of the dielectric in the trench cut, to reduce parasitic capacitance. Moreover, a SiGe85% sacrificial layer is selectively grown around the source-drain epitaxy thus being replaced with a TS liner to avoid the Ge diffusion issues caused by high temperature thermal HK annealing.

Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including logic or memory cells, particularly in the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A device comprising:
 a gate structure formed over a substrate, the gate structure comprising a high dielectric constant metal gate (HKMG), a gate cap disposed over the HKMG, and gate sidewall spacers;

source-drain epitaxy contacts including a trench silicide (TS) liner covering the source-drain epitaxy contacts;

TS contacts formed on the TS liner over the source-drain epitaxy contacts; and a tapered dielectric pillar disposed in a TS cut between the source-drain epitaxy contacts, wherein the TS liner is further formed between the tapered dielectric pillar and the TS contacts, and wherein the TS liner wraps around the source-drain epitaxy contacts, including bottom negatively tapered surfaces of the source-drain epitaxy contacts, and wherein the tapered dielectric pillar comprises at least a void or airgap at the bottom of the TS cut adjacent the negatively tapered surfaces of the source-drain epitaxy contacts.

2. The device according to claim 1, wherein the TS contacts comprise tungsten (W).

3. The device according to claim 2, wherein the TS liner comprises titanium (Ti).

4. The device according to claim 3, wherein the TS liner has a thickness of 2 to 5 nanometers (nm).

5. The device according to claim 1, wherein source-drain epitaxy contacts comprise a silicon containing phosphorus (Si:P) for an n-type field-effect transistor (FET).

6. The device according to claim 5, wherein the tapered dielectric pillar comprises SiCBN.

7. The device according to claim 1, wherein the tapered dielectric pillar is formed over a shallow trench isolation (STI) region formed in the substrate.

8. A device comprising:

a gate structure formed over a substrate;

source-drain epitaxy contacts including a trench silicide (TS) liner covering the source-drain epitaxy contacts;

TS contacts formed on the TS liner over the source-drain epitaxy contacts; and a tapered dielectric pillar disposed in a TS cut between the source-drain epitaxy contacts, wherein the TS liner wraps around the source-drain epitaxy contacts, including bottom negatively tapered surfaces of the source-drain epitaxy contacts, and wherein the tapered dielectric pillar comprises at least a void or airgap at the bottom of the TS cut adjacent the negatively tapered surfaces of the source-drain epitaxy contacts.

9. The device according to claim 1, wherein the tapered dielectric pillar comprises the void at the bottom of the TS cut adjacent the negatively tapered surfaces of the source-drain epitaxy contacts.

10. The device according to claim 1, wherein the tapered dielectric pillar comprises the airgap at the bottom of the TS cut adjacent the negatively tapered surfaces of the source-drain epitaxy contacts.

11. The device according to claim 8, wherein the tapered dielectric pillar comprises the void at the bottom of the TS cut adjacent the negatively tapered surfaces of the source-drain epitaxy contacts.

12. The device according to claim 8, wherein the tapered dielectric pillar comprises the airgap at the bottom of the TS cut adjacent the negatively tapered surfaces of the source-drain epitaxy contacts.

13. The device according to claim 1, wherein the TS contacts comprise cobalt (Co).

14. The device according to claim 1, wherein the TS contacts comprise ruthenium (Ru).

15. The device according to claim 1, wherein source-drain epitaxy contacts comprise silicon germanium doped with boron (SiGe:B), Ge% [30-50%] for a p-type FET.

16. The device according to claim 5, wherein the tapered dielectric pillar comprises a low dielectric constant (low-k) material containing carbon.

17. The device according to claim 5, wherein the tapered dielectric pillar comprises SiOC.

18. The device according to claim 5, wherein the tapered dielectric pillar comprises SiCON.

* * * * *